United States Patent [19]

Broadt et al.

[11] 4,371,914
[45] Feb. 1, 1983

[54] PHOTOFLASH UNIT WITH CIRCUIT BOARD RADIATION SWITCHES FOR SELECTIVE PAIRING OF LAMPS

[75] Inventors: David R. Broadt, Lewisburg; Donald E. Armstrong; Carl F. Kackenmeister, both of Williamsport, all of Pa.

[73] Assignee: GTE Products Corporation, Stamford, Conn.

[21] Appl. No.: 217,722

[22] Filed: Dec. 18, 1980

[51] Int. Cl.³ .............................................. G03B 15/02
[52] U.S. Cl. ...................................... 362/15; 362/11; 362/13
[58] Field of Search ....................... 362/11, 13, 14, 15, 362/16, 8

[56] References Cited

U.S. PATENT DOCUMENTS 4,136,377 1/1979 Fohl ........................................ 362/13
4,320,440 3/1982 Brower ................................. 362/13

*Primary Examiner*—Donald P. Walsh
*Attorney, Agent, or Firm*—Edward J. Coleman

[57] ABSTRACT

A photoflash unit comprising a plurality of 2n flashlamps attached to a printed circuit board and disposed in a linear array with the longitudinal axes of respective lamps aligned in parallel. Circuit patterns on the circuit board include a plurality of n selective terminal means, each associated with a respective pair of the lamps and connected to one lead-in wire of each of the lamps of the associated pair, and a common terminal associated with all of the 2n lamps but directly connected to the other lead-in wire of one lamp of each pair. The circuit board has a substantially rectangular portion with n spaced apart extensions projecting vertically from a longer side thereof, the extensions being located behind alternate lamps of the linear array. Each extension contains portions of the circuit patterns spaced apart to form predetermined gaps, and a mass of switch material is disposed on each extension to bridge the gap between circuit patterns to thereby provide a solid state radiation switch on each extension behind and adjacent to a respective lamp for receiving radiant energy emitted by that lamp. In this manner, a respective normally open switch on each circuit board extension is coupled between the common terminal and a lead-in wire of the other lamp of each pair of lamps, so that the n normally open switches are coupled between the common circuit lead-in wire of associated pairs of the 2n lamps.

11 Claims, 6 Drawing Figures

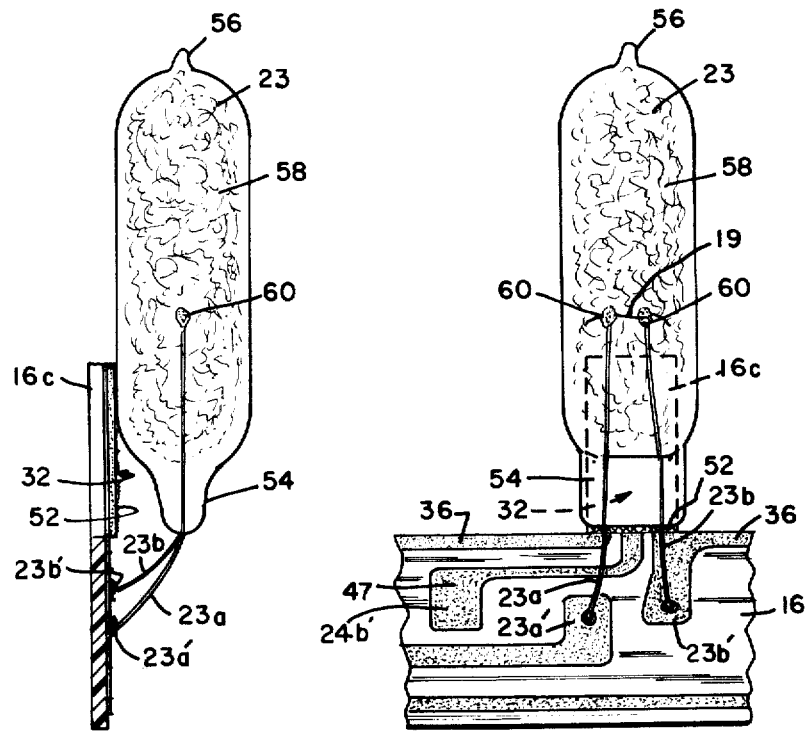

PHOTOFLASH UNIT WITH CIRCUIT BOARD RADIATION SWITCHES FOR SELECTIVE PAIRING OF LAMPS

BACKGROUND OF THE INVENTION

This invention relates to multilamp photoflash units having circuit means for causing a different lamp to be flashed upon each occurrence of a firing pulse produced in synchronism with the opening of a camera shutter.

Numerous multilamp photoflash arrangements with various types of sequencing circuits have been described in the prior art. Series and parallel-connected lamp arrays have been shown which are sequentially fired by mechanical switching means, simple electrical circuits, switching circuits using the randomly varied resistance characteristics of the lamps, arc gap arrangements, complex digital electronic switching circuits, light-sensitive switching means and heat-sensitive switching devices which involve melting, fusing or chemical reaction in response to the radiant energy output of an adjacently located flashlamp.

One currently marketed eight-lamp photoflash unit employing radiation switches is described in U.S. Pat. Nos. 3,894,226 and 4,017,728 and referred to as a flip flash. A ten-lamp version is described in U.S. Pat. Nos. 4,156,269 and 4,164,007. The unit comprises a planar array of high voltage flashlamps mounted on a printed circuit board with an array of respectively associated reflectors. Circuitry on the board includes a plurality of solid state switches that chemically change from a high to low resistance, so as to become electrically conducting after exposure to the radiant heat energy from an ignited flashlamp operatively associated therewith. The lamps of the array are arranged in two equal groups disposed in the upper and lower halves respectively of the rectangular-shaped circuit board. A pair of terminal contacts at the lower end of the unit is provided for activation of the upper group of lamps while a set of terminal contacts at the top of the unit is operatively associated with the lower group of lamps. The application of successive high-voltage pulses (e.g., 500 to 4,000 volts from, say, a piezoelectric source controlled by the shutter of a camera in which the array is inserted) to the terminal contacts at the lower end of the unit causes the lamps at the upper half of the array to be sequentially ignited. The array is then turned end for end and again inserted into the camera in order to flash the remaining group of lamps. In the flip flash unit, therefore, all of the lamp sequencing circuitry is self-contained in the removable photoflash unit, and the only function of the camera is to produce successive firing pulses in response to actuation of the camera shutter.

Another type of multilamp array currently on the market employs lamp-reflector units in linear rows facing in opposite directions, such as described in U.S. Pat. Nos. 3,598,984; 3,598,985; and 4,032,769 referred to as a flash bar. Typically, such linear photoflash lamp arrays comprises a total of ten lamps arranged in two parallel rows of five lamps each, the lamps and reflectors of one row being staggered relative to the lamps and reflectors of the other row. The five lamps facing in one direction are connected to a respective firing circuit disposed on one side of a printed circuit board having a plug-in tab, and the five lamps facing in the opposite direction are connected to a respective firing circuit on the opposite side of the printed circuit board. Each of the lamps has a pair of lead-in wires, one of which is connected to a common circuit run which leads to a common terminal on the plug-in tab, while the other lead-in wire of each of the lamps of a group of five facing in one direction are connected to respective conductor runs leading to a set of five selective terminals on the respective side of the circuit board tab, e.g., see the aforementioned U.S. Pat. No. 3,598,985. The circuitry of this prior art flash bar unit contains no switching elements; hence, as described, for example in U.S. Pat. Nos. 3,618,492 and 3,757,643, one-at-a-time sequencing of the five lamp facing in one direction is provided by sequential application of low voltage firing pulses across the associated common terminal and successive ones of the associated selective terminal. That is, when the linear flash bar array is plugged into a camera, each time the shutter is actuated, electronic switching circuitry in the camera successively applies firing pulses in sequence to the five selective terminals (and associated common terminal) on the side of the circuit board to which the five lamps facing the camera subject are connected. When the five lamps facing in one direction are expended, the flash unit must be removed from the camera, rotated 180 degrees, and then reinserted in the camera circuit so that the five unused lamps are connected to the camera switching circuitry.

In the interests of compactness, simplicity of operation, and increasing the number of flash illuminated photographs that may be taken in rapid succession, it is desirable to provide a multilamp photoflash array in which all of the lamps face in the same direction and only a single set of connector terminals is required, so that removal and reorientation of the flash unit is unnecessary. Further, it is particularly desirable to provide a photoflash lamp array which is compatible with existing camera circuitry.

SUMMARY OF THE INVENTION

Accordingly, it is an object of the present invention to provide a multilamp photoflash unit having improved circuit means for permitting reliable flashing of all of the lamps of the array in a predetermined sequence in response to firing pulses applied to a single set of terminal means.

A principle object of the invention is to provide an improved switching circuit implementation for an array of photoflash lamps which is adapted for operation by a firing pulse switching circuit capable of sequencing only one half of the total number of lamps of the array but including a monitoring function for pretesting unexpended lamps.

Yet another object is to provide an arrangement of solid-state radiation switches on a printed circuit board for economically accomplishing the aforementioned object functions in a reliable and compact unit package.

These and other objects, advantages and features are attained, in accordance with the invention, by a photoflash unit having means for sequentially flashing pairs of lamps (one lamp at time) in an array using only one selective terminal per lamp pair together with a common circuit terminal. The photoflash unit comprises a printed circuit board having electrically conductive circuit patterns disposed on a surface thereof, and a plurality of 2n flashlamps attached to the circuit board and disposed in a linear array with the longitudinal axes of respective lamps aligned in parallel, each of the lamps being electrically connected to respective portions of the circuit patterns. The circuit board is a substantially rectangular portion with n spaced apart extensions projecting from a longer side thereof, the extensions being located behind alternate lamps of the linear array. Each circuit board extension contains portions of the conductive circuit patterns spaced apart to form predetermined gaps therebetween, and a mass of switch material is disposed on each of the extensions to bridge the gap between circuit patterns. In this manner, a solid-state radiation switch is provided on each of the circuit board extensions behind and adjacent to a respective lamp for receiving radiant energy emitted by that lamp.

The circuit patterns include a plurality of n+1 terminal areas at one side of the circuit board and a plurality of 4n lamp contact areas dispossed on the rectangular portion of the circuit board. Each of the lamps has first and second lead-in wires secured in electrical connection with respective ones of the lamp contact areas, and all of the terminal areas and lamp contact areas connected to the lead-in wires are disposed in the same one side of the circuit board. In one example of a specific embodiment, the 2n lamps are disposed in a horizontal array, and the n extensions of the circuit board project vertically above the rectangular portion thereof. The portions of the circuit patterns on each extension extend vertically toward the top end thereof, and the mass of switch material on each extension interconnects the vertically extending spaced apart circuit patterns thereon. All but one of the terminal areas on the circuit board, i.e., n terminal areas, are selective terminals each associated with a respective pair of the 2n lamps. Each of the selective terminals are electrically connected via one of the circuit patterns to a pair of lamp contact areas, which in turn are each connected to the first lead-in wire of one lamp of a respective pair thereof. The remaining one of the terminal areas is a common terminal associated with all of the 2n lamps and directly connected via one of the circuit patterns to n lamp contact areas, each of which is connected to the second lead-in wire of one of the lamps of each of the respective pairs of 2n lamps. Each of the lamps directly connected to the common terminal are disposed in front of and adjacent to a respective one of the circuit board extensions, and the circuit pattern directly connected to the common terminal has a vertically extending portion on a respective extension. The second lead-in wire of the other of the lamps of each of the respective pairs of 2n lamps is connected to a respective lamp contact area which is connected to a respective one of the circuit patterns having a spaced apart vertically extending portion on a respective circuit board extension. Each of the radiation switches is capable of conversion from a high electrical resistance to a low electrical resistance when exposed to radiation emitted from a flashlamp disposed adjacent to the switch.

In a preferred embodiment, the predetermined gap between the spaced apart portions of circuit patterns on each circuit board extension is in the range of 0.010 inch to 0.060 inch. Each flashlamp has a tubular envelope, and the width of each of the circuit board extensions is at least one-half the inside diameter of the respectively adjacent lamp envelope. Further, each circuit board extension projects vertically to at least one-half of the height of the ignition means in a respectively adjacent lamp.

In operation, the common and selective terminals are adapted for connection to a source of firing pulses, and each of the switches is responsive to flashing of the directly connected lamp of an associated pair so as to connect the other lamp of that associated pair of the common terminal means. The lamps have a filament-type ignition means, and the resistance value of each lamp filament lies within a predetermined range of a resistance values. In this manner, the firing circuit to which the lamp array terminal means are connected can perform a monitoring function by passing a current of limited predetermined maximum value through each unexpended flashlamp to derive alignment signals which function to align a flashlamp sequencing circuit to bypass inoperative lamps. Accordingly, if the photoflash unit comprises ten lamps operated from a common terminal and five selective terminals, a first firing pulse will cause ignition of the directly connected lamp of the first pair of lamps, whereupon the normally open radiation switch asociated with that pairs of lamps will be converted from a high to low resistance so as to directly connect the second of the first pair of lamps between the first selective terminal means and the common terminal means. Thereafter the second firing pulse will bypass the expended first lamp and cause the second lamp to be ignited via the actuated radiation switch connected between that lamp and the common terminal means. The third firing pulse will then be applied to the second terminal means connected to the second pair of lamps to ignite the lamp directly connected to that second terminal means. This firing sequence proceeds through the remaining lamps and lamp pairs as described with respect to the first lamp pair. The printed circuit board extensions particularly facilitate this operational arrangement in a compact, low-cost photoflash unit. The printed circuit implementation also provides maximum contact area for reliable activation of the radiation switch paste, and the circuit gap tolerance is provided by this design can be readily mass-produced.

BRIEF DESCRIPTION OF THE DRAWINGS

This invention will be more fully described hereinafter in conjunction with the accompanying drawings, in which:

FIG. 3 is an enlarged cross sectional view taken along 3—3 of FIG. 2;

FIG. 4 is an enlarged side view, partly in section taken along 4—4 of FIG. 2, showing a lamp connected to the circuit board of FIG. 2 adjacent an extension thereof;

FIG. 5 is a fragmentary elevational front view of FIG. 4, with lamp 24 omitted for clarity.

DESCRIPTION OF PREFERRED EMBODIMENT

Figure 1:
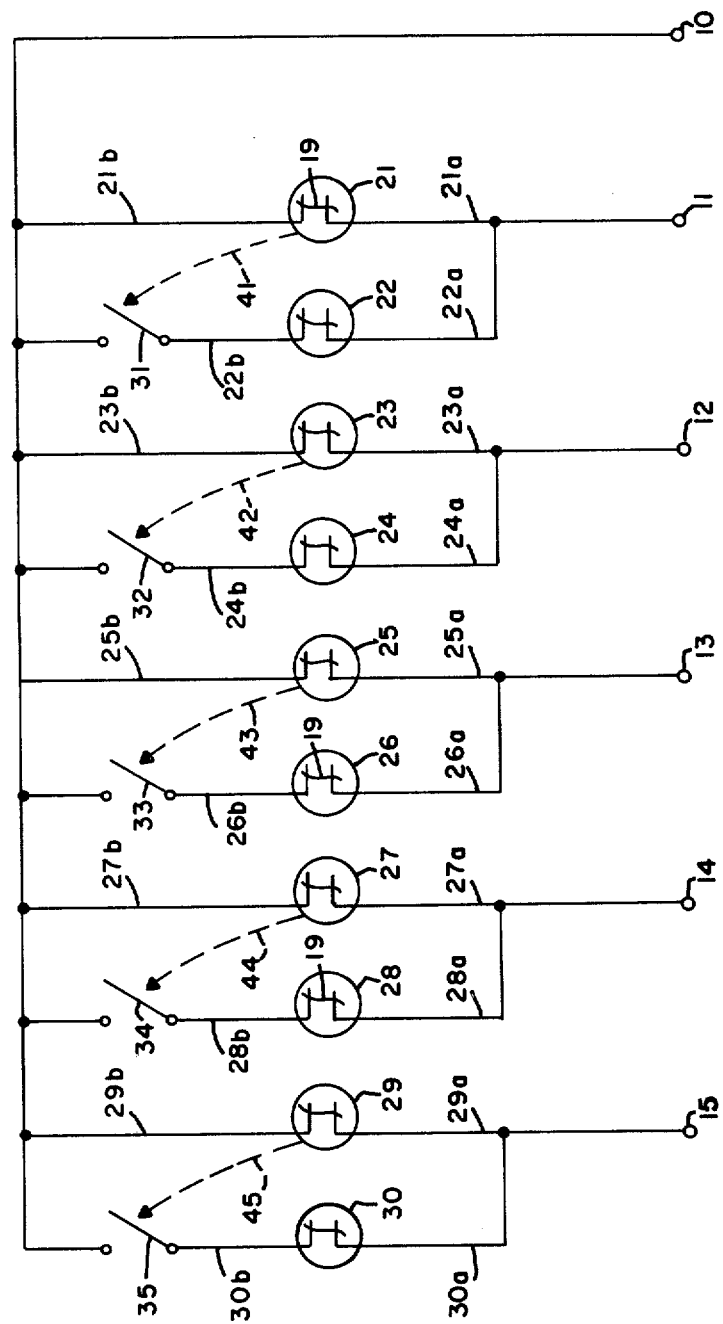
FIG. 1 is an electrical schematic diagram of a circuit used in the photoflash unit of the invention.

The present photoflash unit provides a useful implementation of a circuit for selectively operating pairs of lamps, one at a time, in a linear array through an arrangement of solid state radiation switches. FIG. 1 shows a schematic diagram of a specific circuit particularly useful for this function of selective pairing of photoflash lamps and which is described in a copending application Ser. No. 156,991, filed June 6, 1980 and assigned to the present assignee. The circuit is provided with a common terminal 10 and five selective terminals 11–15 adapted for engagement with a socket contact of a source of lamp firing pulses. For example, the source of firing pulses may comprise an electronic circuit such as that described in U.S. Pat. No. 3,618,492, which may be incorporated in a camera or a flash attachment for use with the camera and adapted to generate low voltage pulses in synchronization with the actuation of a camera shutter mechanism. The circuit includes an array of ten photoflash lamps 21–30, which may be of the low voltage type, each containing a filament 19 connected across a pair of lead-in wires 21a, 21b, etc., and adapted for initiating a flash of combustible material contained within the bulb.

The array of ten lamps 21–30 are arranged in five pairs which are respectively associated with the five selective terminals 11–15. Each of the selective terminals 11–15 is connected in electrical circuit to a first lead-in wire of each of the lamps of a respective pair of lamps. That is, terminal 11 is connected to lead-in wires 21a and 22a of lamps 21 and 22, respectively; selective terminal 12 is connected to lead-in wires 23a and 24a of lamps 23 and 24, respectively; terminal 13 is connected to lead-in wires 25a and 26a of lamps 25 and 26, respectively; terminal 14 is connected to lead-in wires 27a and 28a of lamps 27 and 28, respectively, and the selective terminal 5 is connected to lead-in wires 29a and 30a of lamps 29 and 30, respectively.

Common terminal 10 is associated with all ten of the lamps 21–30 and directly connected in electrical circuit to a second lead-in wire of one of the lamps of each of the respective pairs of lamps. That is, common terminal 10 is directly connected to lead-in wires 21b, 23b, 25b, 27b and 29b of lamps 21, 23, 25, 27 and 29, respectively.

The array circuit further includes a plurality of flash-actuated, normally open switches 31–35 which are positioned external of and adjacent to respective ones of the lamps of the array which are directly connected between a selective terminal and the common terminal. Each normally open switch is coupled in electrical circuit between the common terminal and the second lead-in wire of the non-directly-connected lamp of an associated pair of lamps. Further, each of these switches is coupled in electrical circuit between the second, or common circuit, lead-in wires of a respective pair of lamps. More specifically, a first switch 31 is coupled between common terminal 10 and lead-in wire 22b, and also between wires 21b and 22b, and disposed adjacent to the first lamp 21, as indicated by the dashed line arrow 41; a second switch 32 is coupled between common terminal 10 and lead-in wire 24b, and also between wires 23b and 24b, and associated with or positioned near the third lamp 23 as indicated by the dashed line arrow 42; a third switch 33 is coupled between common terminal 10 and lead-in wire 26b, and also between wires 25b and 26b, and disposed adjacent to the fifth lamp 25 as indicated by the dashed line arrow 43; a fourth switch 34 is coupled between common terminal 10 and lead-in wire 28b and also between wires 27b and 28b, and disposed adjacent to the seventh lamp 27, as indicated by the dashed line arrow 44; and a fifth switch 35 is coupled between common terminal 10 and lead-in wire 30b, and also between wires 29b and 30b, and positioned adjacent to the ninth lamp, as indicated by the dashed line arrow 45.

Figure 2:
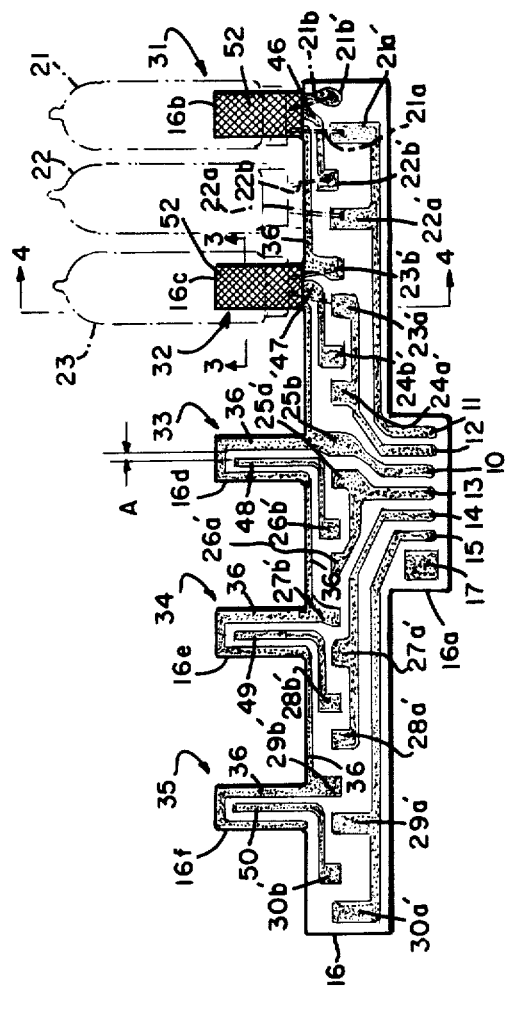
FIG. 2 is a front elevation of a circuit board of a photoflash unit according to the invention, three attached lamps being shown in phantom, and switch paste being shown on only two of the extensions of the circuit board for better clarity in illustrating the circuit patterns.
Figure 6:
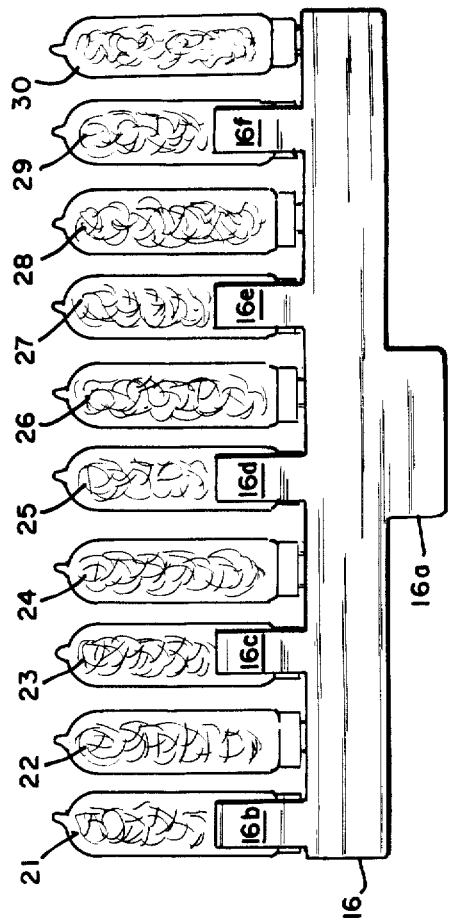
FIG. 6 is a rear elevation showing the photoflash unit circuit board with all ten lamps attached.

FIG. 2 illustrates an implementation of this photoflash array circuitry, in accordance with the present invention, wherein conductor runs are disposed in a pattern on a uniquely shaped printed circuit board containing solid state radiation switches. The circuit board 16 has a substantially rectangular portion with a depending tab 16a which is significantly narrower than the long lower side of the circuit board from which the tab projects. Further, in accordance with the invention, the long upper side of the circuit board has five spaced apart extensions 16b–16f which extend vertically above the rectangular portion of the circuit board. The ten lamps 21–30 are attached to the circuit board, as shall be described in detail hereinafter, and disposed in a horizontal linear array with the longitudinal axes of respective lamps aligned in parallel, as best shown in the rear view of the unit of FIG. 6. The lamps and circuit board extensions are disposed at regular intervals, as illustrated, with the circuit board extensions being located behind alternate lamps of the linear array. Thus, extension 16b is disposed behind lamp 21; extension 16c is disposed behind lamp 23; extension 16d is disposed behind lamp 25; extension 16e is disposed behind lamp 27; and extension 16f is disposed behind lamp 29. Further, lamp 22 is disposed between the extensions 16b and 16c; lamp 24 is disposed between the extension 16c and 16d; lamp 26 is disposed between the extension 16d and 16e; lamp 28 is disposed between the extensions 16e and 16f; and lamp 30 is disposed between extension 16f and the end of the circuit board.

Located adjacent to one another on tab 16a are the terminal areas 10–15 at one side edge thereof which are selectively interconnected via conductor runs, either directly or through switches 31–35, with a plurality of lamp contact areas 21a', 21b' through switches 30a', 30b', which are disposed on the rectangular portion of the circuit board. Each of the flashlamps 21–30 has a pair of lead-in wires 21a, 21b, etc., which are attached to respective ones of the lamp contact areas 21a', 21b', etc., such as by soldering. For example the attachment of the lead-in wires of lamps 21, 22 and 23 are illustrated in phantom in FIG. 2, and the attachment of the lead-in wires of lamp 23 to the circuit board contact areas are illustrated in FIGS. 4 and 5. Returning to the conductive circuit pattern, the terminal 10 forms part of, and is connected to, a common circuit conductor run 36 which is directly connected in electrical circuit to a lead-in wire of one of the lamps of each of the respective pairs of lamps at lamp contact areas 21b', 23b', 25b', 27b', and 29b'. Each of the selective terminals 11–15 is connected in electrical circuit to a lead-in wire of each of the lamps of a respective pair of lamps via the associated lamp contact areas. That is, selective terminal 11 is directly connected to lamp contact areas 21a' and 22a'; selective terminal 12 is directly connected to lamp contact areas 23a' and 24a'; selective terminal 13 is directly connected to lamp contact areas 25a' and 26a'; selective terminal 14 is directly connected to lamp contact areas 27a' and 28a'; and the selective terminal 15 is directly connected to lamp contact areas 29a' and 30a'.

The common terminal 10 and the five selective terminals 11–15 on tab 16a are adapted for engagement with the socket contacts of a source of lamp firing pulses. For example, the source of firing pulses for connection to these terminals may comprise an electronic circuit such as that described in U.S. Pat. No. 3,618,492, which may be incorporated in a camera or a flash attachment for use with the camera and adapted to generate low voltage pulses in synchronization with the actuation of a camera shutter mechanism. Also shown on tab 16a is a conductive strip 17 for bridging camera socket contacts to convert to the camera to a flash mode of operation, as described in U.S. Pat. No. 3,757,643.

The entire printed circuit is provided on the same one side of the circuit board, namely, the obverse side of the board to which the flashlamp lead-in wires are connected. The substrate of circuit board 16 comprises an insulating material, such as XP phenolic, and the pattern of electrically conductive circuit runs is provided on the board surface by means such as silk screening, chemical etching, etc. According to a preferred embodiment, however, the circuit patterns are formed of die-stamped copper, thereby providing significant cost advantages. For example, U.S. Pat. No. 3,990,142 describes a die-stamped printed circuit board, and copending applications Ser. Nos. 131,614 and 131,711, both filed Mar. 19, 1980, and assigned to the present assignee, describe die-stamped circuit boards for photoflash devices.

Referring now more particularly to the normally open connect switches 31–35, each such switch preferably comprises a solid state mass of material interconnected to spaced-apart electrical terminals in the circuit. In accordance with the present invention, each of these switches are located on a respective one of the circuit board extensions and are formed by portions of the conductive circuit patterns spaced apart on the extension to form predetermined gaps therebetween and having a mass of switch material disposed thereover to bridge the gap between the circuit patterns. More specifically, in the embodiment illustrated by FIGS. 2–5, each of the circuit board extensions 16b–16f contain three conductor run segments which extend vertically thereon for substantially the full height of the circuit board segment. Two of these vertical conductor segments comprise portions of the common circuit conductor run 36, which follows a continuous path adjacent to and along nearly the entire length of the top periphery of the circuit board. Disposed between and spaced apart from these two common circuit vertical segments is an open ended vertical extension of a conductor run terminating at a respective one of the lamp contact areas 22b', 24b', 26b' and 30b'. That is, the central vertical conductor on each extension is connected to one of the lead-in wires of a lamp disposed adjacent to but not in front of that respective circuit board extension, that lead-in wire being connected to the common circuit conductor run 36 upon activation of the associated switch. Hence, lamp contact area 22b' (which is connected to lead-in wire 22b of lamp 22) is part of a conductor run 46 which extends vertically on the circuit board extension 16b in a spaced apart relationship between vertical segments on the common circuit conductor run 36; these runs form the terminal components of switch 31. Next, lamp contact area 24b' (associated with lamp 24) forms a part of the conductor run 47 which extends vertically along the center of circuit board extensions 16c to form, together with the straddling common circuit runs, the terminals of switch 32. Next, lamp contact area 26b' forms part of conductor run 48 which extends centrally and vertically on the circuit board extension 16d to form, together with the spaced apart and adjacent common conductor runs, the terminals of switch 33. Lamp contact area 28b' forms a part of the conductor run 49 which extends vertically on circuit board extension 16e to form together with the spaced apart, adjacent common circuit runs 36, the terminals of switch 34. Finally, lamp contact area 30b' forms part of a conductor run 50 which extends centrally and vertically on the circuit board extension 16f to form, together with the spaced apart vertical segments of common conductor 36, the terminals of switch 35.

Each of the switches is then completed by disposing a mass of switch material 52 on at least a portion of each of the extensions to cover substantially the full width thereof and thereby bridge and interconnect the vertically extending circuit conductors on the surface of the extension. In FIG. 2 the switch material is illustrated covering a portion of one side of the circuit board extensions 16b and 16c, and FIG. 3 illustrates a cross section of the circuit board extension 16c with the switch mass 52 bridging the conductor runs 36 and 47.

The material 52 for the connect switches is selected to be of the type initially having an open circuit or high resistance, the resistance thereof becoming converted to a lower value when the material receives radiation in the form of heat and/or light from a respective, adjacent lamp upon the lamp being flashed. One type of solid state switch which operates in this manner is described in U.S. Pat. No. 3,458,270 of Ganser et al, in which the use of silver oxide in a polyvinyl binder is taught as a normally open radiant energy switch. Upon radiant heating, the silver oxide decomposes to give a metallic silver residue which is electrically conductive.

A preferred switch composition for a photoflash array operated by low voltage firing pulses, such as the present specific embodiment, is described in a copending application Ser. No. 148,358, filed May 9, 1980 and assigned to the present assignee, and comprises by dried weight 35–70% silver carbonate and/or silver oxide, 30–60% silver-coated glass beads, and 1–20% binder. Further modifications of the switch composition for facilitating control of the switch conversion time are described in a copending application Ser. No. 148,119, filed May 9, 1980 and assigned to the present assignee.

A specific example of a low voltage switch composition, particularly useful in this application and described in the aforementioned copending application Ser. No. 148,358, comprises the following dried weight proportions: 50% silver carbonate, 40% silver coated glass beads, and 10% polystyrene binder. The mixture is made into a paste by ball milling in a suitable solvent such as butyl cellosolve acetate. The solids content may be adjusted to suit the method of switch application. For silk screening over the circuit board, we prefer to adjust the solids content to about 74%. This low voltage switch paste was then screen-printed using a 105 mesh stainless steel screen with a two mil emulsion build-up. The gap A (see FIG. 2) between spaced apart copper conductor runs on each of the circuit board extensions was about 0.030 inch. The mixture is deposited as a mass of material across these spaced apart conductor runs to provide a patch of paste material 52 which covers about 0.037 square inch on each circuit board extension, as illustrated for switches 31 and 32 in FIG. 2, and as shown in different views for switch 32 in FIGS. 3 and 4.

When the flashlamps 21–30 are mounted on the circuit board 16, as illustrated, each of the switches 31–35 are then disposed behind alternate ones of the linear array of flashlamps, with each of the flashlamps 21, 23, 25, 27 and 29 being in near contact with the surfaces of switches 31–35, respectively. For example, the positioning of flashlamp 23 with respect to switch 32 on circuit board extension 16c is illustrated in FIGS. 4 and 5. As particularly shown for lamp 23 in FIGS. 4 and 5, each of the lamps 21, etc., has a tubular, hermetically sealed, light-transmitting glass envelope having a press seal base 54 at one end through which the lead-in wires emerge and a tip off 56 at the other end. The exterior of the envelope is coated with a transparent protective material (not shown), such as cellulose acetate lacquer, and the interior is filled with a quantity of filamentary combustible material 58, such as shredded zirconium, and a combustion supporting gas, such as oxygen. The ignition means within the lamp envelope comprises a filament 19 connected across the inner ends of the lead-in wires (in this case the leads 23a and 23b) with beads of primer material 60 disposed about the junction of the lead-in wires and the filament.

As illustrated, each of the extended portions of the circuit board that supports a the radiation-activated switch should be sized so that the width thereof is at least one-half the inside diameter of the respectively adjacent lamp envelope, and the vertical projection of the extension above the rectangular portion of the circuit board is at least one-half of the heighth of the ignition means in the respectively adjacent lamp. In a preferred construction, each of the circuit board extensions has a width of about 0.170 inch (85% of the ID of the lamp envelope) and a length of 0.400 inch (120% of the heighth of the ignition means). As previously described, the circuit patterns extend vertically on each of the extensions for substantially the full height thereof, and the switch material is disposed to cover substantially the full width of the extension and thereby bridge the gaps between and interconnect the vertically extending circuit patterns thereon. In this manner, additional length is provided over prior art solid state switches to obtain a long circuit path and assure low ohmic switch contact-to-circuit runs. The design provides maximum contact area for reliable activation of the radiation-activated switch paste; that is, there is a large surface area over which a radiant, activated switch material can make contact to the circuit. This is particularly desirable due to the variations in radiation from individual lamps. Additional switch surface area can be provided if irregular shaped circuit runs are used instead of straight runs. Another advantageous aspect of the invention is that the described switch implementation provides circuit gap tolerances that can be more easily mass produced. For example, the gap A (see FIG. 2) between the conductor runs may vary from 0.010 inch to 0.060 inch, with a preferred gap of about 0.030 inch. The actual switch closure time is more readily controlled with the chemical composition of the radiation-activated switch paste, with very little or no effect from circuit gap.

A particularly useful reflector configuration which may be employed with the present photoflash unit is described in copending application Ser. No. 217,723, filed Dec. 18, 1980, concurrently herewith and assigned to the present assignee, and a useful housing enclosure for the unit as described in copending application Ser. No. 181,936, filed Aug. 27, 1980 and assigned to the present assignee.

The unit functions as follows upon the terminals 10 and 11-15 being connected to a source of firing pulses, for example, such as described in the previously mentioned U.S. Pat. Nos. 3,618,492 and 3,757,643. Assuming that none of the ten lamps of the unit have been flashed, upon occurrence of a first firing pulse across terminals 10 and 11, this pulse will be directly applied to the lead-in wires of the first connected flashlamps 21, whereupon the lamp 21 flashes and becomes an open circuit between its lead-in wires 21a and 21b. Heat and/or light radiation from the flashing first lamp 21 is operative via path 41 (FIG. 1) to activate the normally open switch 31 located on circuit board extension 16b immediately behind the lamp. The radiation causes the normally open connect switch 31 to become a closed circuit (or a low value of resistance), thereby connecting common terminal 10 to the second lamp 22. By the time this occurs, the firing pulse should have diminished to a value insufficient to cause the second lamp 22 to flash.

In the electronic circuit described in the aforementioned U.S. Pat. No. 3,618,492, a monitoring function is provided wherein a current of limited predetermined maximum value is applied through each unexpended flashlamp. This monitoring current is generated prior to the ignition of a given one of the flashlamps. In this manner, alignment signals are derived which function to align the flashlamp sequencing circuit to bypass inoperative flashlamps. This monitoring function is dependent upon the resistance across the lamp lead-in wires. Accordingly, the resistance values of lamp filaments are selected to lie within a predetermined range; typically, the filament in each lamp has a resistance value in the range of about 0.5 to 1.5 ohms. Thus, if the monitoring circuit senses a significantly higher resistance across the lamp lead-in wires, say, for example, higher than 50 ohms or 75 ohms, the selected terminal connected to that lamp will be bypassed, and the firing pulse will be applied across the operative lamp connected to the next successive selective terminal. On the other hand, if the monitoring circuit senses a resistance below the preselected level (that is, below 50 ohms or 75 ohms) a firing pulse will be applied to the selective terminal connected to that lamp.

In the present instance, with the first lamp 21 having been fired, but with the switch 31 having been closed, the monitoring circuit would continue to sense an unexpended lamp, namely, lamp 22, connected between selective terminal 11 and the common terminal 10. Accordingly, when the next firing pulse occurs, it is applied to the lead-in wires of the second lamp 22, via the now closed connect switch 31, whereupon the second lamp 22 flashes. Since both lamps 21 and 22 have now been fired, the monitoring circuit will cause the firing pulse alignment to bypass terminal 11 and proceed to terminal 12, to which the unexpended lamp 23 is directly connected Hence, when the next firing pulse occurs, it is applied directly to the third lamp 23, thereby firing that lamp, whereupon the radiation from lamp 23 activates connect switch 32 to become essentially a closed circuit across its terminals. The next firing pulse will be applied via the now closed connect switch 32 to lead-in wires of the fourth flashlamp 24, thereupon casing that lamp to flash. The foregoing pattern of operation then continues with respect to selective terminals 13, 14 and 15 to cause the sequential firing of lamps 25-30. Hence, a total of 2n (10) lamps have been ignited from n (5) selective terminals together with a common terminal.

Although the invention has been described with respect to specific embodiments, it will be appreciated that modifications and changes may be made by those skilled in the art without departing from the true spirit and scope of the invention. For example, n may be two or greater, i.e., the circuit board approach is applicable to arrays of four lamps, six lamps, eight lamps, etc. Also, tab 16a may be as wide as or wider than the rectangular portions of circuit board 16.

We claim:

1. A multilamp photoflash unit comprising, in combination:
    a printed circuit board having electrically conductive circuit patterns disposed on a surface thereof;
    a plurality of 2n flashlamps attached to said circuit board and disposed in a linear array with the longitudinal axes of respective lamps aligned in parallel, each of said lamps being electrically connected to respective portions of said circuit patterns;
    said circuit board having a substantially rectangular portion with n spaced apart extensions projecting from a longer side thereof, said extensions being located behind alternate lamps of said linear array;
    each of said circuit board extensions containing portions of said conductive circuit patterns spaced apart to form predetermined gaps therebetween; and
    a mass of switch material disposed on each of said circuit board extensions and bridging said gaps between circuit patterns, thereby providing a solid state radiation switch on each of said extensions behind and adjacent to a respective lamp for receiving radiant energy emitted by that lamp.

2. The photoflash unit of claim 1 wherein said circuit patterns include a plurality of n+1 terminal areas at one side of said circuit board and a plurality of 4n lamp contact areas disposed on said rectangular portion of the circuit board, each of said lamps has first and second lead-in wires secured in electrical connection with respective ones of said lamp contact areas and all of said terminal areas and lamp contact areas, connected to said lead-in wires are disposed on the same one side of said circuit board.

3. The photoflash unit of claim 2 wherein said 2n lamps are disposed in a horizontal array, said n extensions of the circuit board project vertically above the rectangular portion thereof, portions of said circuit patterns extend vertically on each of said circuit board extensions toward the top end thereof, and said mass of switch material on each of said extensions interconnects the vertically extending spaced apart circuit patterns thereon.

4. The photoflash unit of claim 3 wherein n of said terminal areas are selective terminals each associated with a respective pair of said 2n lamps, each of said selective terminals being electrically connected via one of said circuit patterns to a pair of lamp contact areas each connected to the first lead-in wire of a lamp of said respective pair, one of said terminal areas is a common terminal associated with all of said 2n lamps and directly connected via one of said circuit patterns to n lamp contact areas each connected to the second lead-in wire of one of the lamps of each of said respective pairs of 2n lamps, each of said lamps directly connected to the common terminal being in front of and adjacent to a respective one of said circuit board extensions, said circuit patterns directly connected to the common terminal having a vertically extending portion on each of said circuit board extensions, the second lead-in wire of the other of the lamps of each of said respective pairs of 2n lamps is connected to a respective lamp contact area which is connected to a respective one of said circuit patterns having a spaced apart vertically extending portion on a respective circuit board extension, and each of said radiation switches is capable of conversion from a high electrical resistance to a low electrical resistance when exposed to radiation emitted from a flashlamp disposed adjacent to the switch.

5. The photoflash unit of claim 4 wherein n=5.

6. The photoflash unit of claim 1 wherein each of the predetermined gaps between said spaced apart portions of circuit patterns on said circuit board extensions is in the range of 0.010 inch to 0.060 inch.

7. The photoflash unit of claim 1 wherein each of said flashlamps has a tubular envelope, and the width of each of said circuit board extensions is at least one-half the inside diameter of the respectively adjacent lamp envelope.

8. The photoflash unit of claim 1 wherein each of said flashlamps has an hermetically sealed tubular envelope with a base at one end and an ignition means sealed through said base and extending within said envelope, said 2n lamps are disposed base down in a horizontal array with the envelopes thereof projecting vertically above the rectangular portion of said circuit board, and said n extensions of the circuit board project vertically above the rectangular portion thereof to at least one-half of the height of the ignition means in respectively adjacent lamps.

9. The photoflash unit of claim 8 wherein the width of each of said circuit board extensions is at least one-half the inside diameter of the respectively adjacent lamp envelope.

10. The photoflash unit of claim 9 wherein each of the predetermined gaps between said spaced apart portions of circuit patterns on said circuit board extensions is in the range of 0.010 inch to 0.060 inch.

11. The photoflash unit of claim 10 wherein portions of said circuit patterns extend vertically on each of said circuit board extensions for substantially the full height thereof, and said mass of switch material is disposed on at least a portion of each of said extensions to cover substantially the full width thereof and thereby interconnect the vertically extending circuit patterns thereon.

* * * * *